ively Motor Vehicles

United States Patent [19]
Burckhardt et al.

[11] 3,942,036
[45] Mar. 2, 1976

[54] BRAKE FORCE CONTROL SYSTEM FOR VEHICLES ESPECIALLY MOTOR VEHICLES

[75] Inventors: Manfred H. Burckhardt, Waiblingen; Hellmut Krohn, Esslingen; Horst Grossner, Geradstetten; Hans-Jörg Florus, Goppingen, all of Germany

[73] Assignee: Daimler-Benz Aktiengesellschaft, Germany

[22] Filed: Feb. 6, 1974

[21] Appl. No.: 440,008

Related U.S. Application Data
[62] Division of Ser. No. 177,744, Sept. 3, 1971, Pat. No. 3,802,747.

[30] Foreign Application Priority Data
Sept. 5, 1970 Germany............................ 2044045

[52] U.S. Cl. ................. 307/229; 307/230; 328/142
[51] Int. Cl.² ........................................ H03K 17/00
[58] Field of Search ........... 307/229, 230, 237, 228; 328/127, 142; 235/183; 330/86, 110

[56] References Cited
UNITED STATES PATENTS
| | | | |
|---|---|---|---|
| 3,128,377 | 4/1964 | Gooddard | 235/183 X |
| 3,153,152 | 10/1964 | Hoffman, Jr. | 307/229 |
| 3,548,323 | 12/1970 | Gordon | 307/237 |
| 3,588,729 | 6/1971 | Satterfield | 330/110 |
| 3,633,043 | 1/1972 | Anthony | 307/230 |

FOREIGN PATENTS OR APPLICATIONS
1,416,687  9/1965  France.............. 307/229

Primary Examiner—Stanley D. Miller, Jr.
Assistant Examiner—B. P. Davis
Attorney, Agent, or Firm—Craig & Antonelli

[57] ABSTRACT

A brake force control system for vehicles, especially for motor vehicles in which one or several electrical signals dependent on the wheel acceleration are compared with predetermined threshold values and in which the resultant electrical signals are utilized for the control of actuating elements such as solenoid valves in the brake circuit, whereby the electrical acceleration signals are weighted in a manner known as such and this weighting is adapted to be influenced or even discontinued when exceeding the threshold value and/or in dependence on the polarity of the acceleration signal.

15 Claims, 6 Drawing Figures

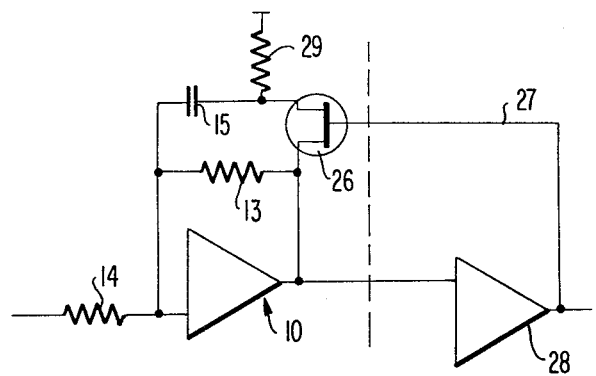
FIG. 3
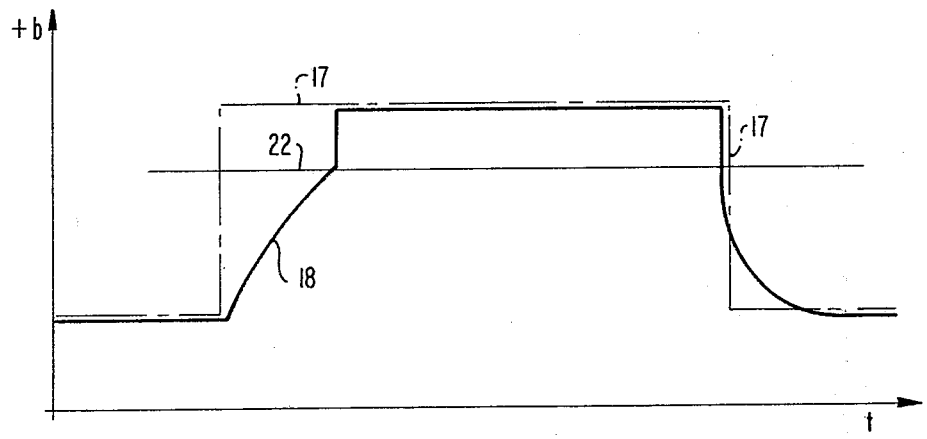
FIG. 4
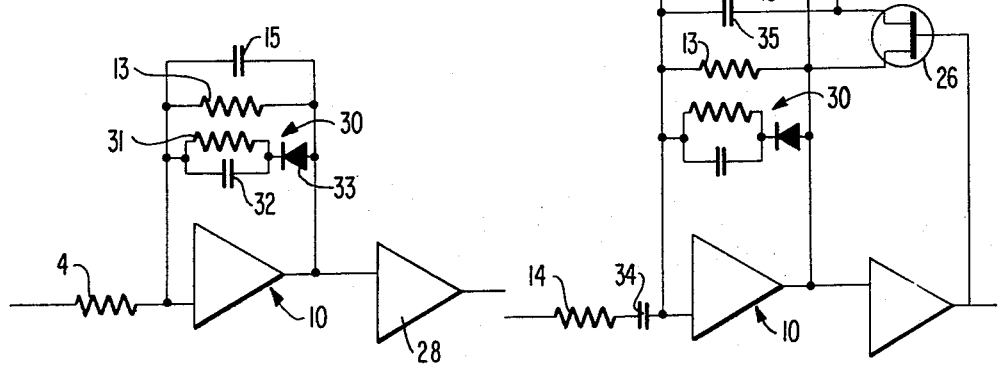
FIG. 6
FIG. 5

BRAKE FORCE CONTROL SYSTEM FOR VEHICLES ESPECIALLY MOTOR VEHICLES

This is a division of application Ser. No. 177,744 filed Sept. 3, 1971 now U.S. Pat. No. 3,802,747.

The present invention relates to a brake force control system for vehicles, especially for motor vehicles, whereby one or several acceleration-dependent electrical signals are compared with predetermined threshold values and the resultant electrical signals serve for the control of actuating members, for example, solenoid valves in the brake circuit.

Fully electronic brake force control systems of the aforementioned type derive their acceleration signals generally by differentiation of the voltage proportional to the wheel rotational speed. A conventional threshold switch is controlled by this differentiated voltage, whose signal is utilized for the decision as regards control of the actuating members in the brake circuit, for example, of electric solenoid valves. In these installations spurious error signals occur, which can be traced back, for example, to the movement of the wheel when passing over road unevennesses. These spurious signals, of course, should not enter the brake force control. In order now to filter out such spurious signals, a so-called integral time behavior is necessary before the threshold formation, i.e., an acceleration pulse which is to be effective for the brake force control system must last for a certain time in order to be able to distinguish the same from shorter spurious signals. However, it is desirable in connection therewith to permit this time behavior to become effective only prior to the threshold value formation and not, for example, generally because otherwise the course and characteristic of the control cycles can be unfavorably influenced during the brake force control.

The present invention is concerned with the task to provide a solution for the aforementioned problems. This task is solved according to the present invention with the brake force control systems described hereinabove in that the electric acceleration signals are weighted or evaluated as a function of time in a manner known as such and that this weighting or evaluation is adapted to be influenced or even discontinued when exceeding the threshold value and/or in dependence on the polarity of the acceleration signal.

The effectiveness of the integral time behavior or transient phenomenon is limited by the construction according to the present invention, to the phase prior to the threshold value formation so that the aforementioned disadvantages cannot occur whereas spurious error signals can be effectively filtered out as before. Additionally, it is also possible with the present invention to weight or evaluate differently acceleration and deceleration signals.

The weighting or evaluation of the acceleration signal in dependence on time, i.e., therefore the integral time behavior can be achieved by a parallel connection of a capacitor with a resistor, which determines proportionately the magnitude of the acceleration signal and which may be arranged, for example, in a voltage divider circuit. However, the present invention prefers a solution according to which an operational amplifier of conventional construction with a capacitor and resistance in the feedback circuit serves for the time-dependent weighting or evaluation of the acceleration signal.

In one solution according to the present invention a diode is connected in parallel to the condenser in the feedback branch, which limits the voltage rise to a value directly above the threshold value. It is achieved in this manner that the threshold value signal is subjected at the beginning to the integral time behavior whereas at the end the threshold value signal proceeds practically without integral time behavior.

Another solution of the present invention resides in that an electronic switching element is series-connected with the condenser in the feedback branch, which eliminates the effectiveness of the condenser when exceeding the switching threshold. A thyristor or the like may be used for that purpose. However, the present invention prefers as switching element a transistor controlled by a conventional threshold switch in such a manner that the transistor is blocked, i.e., becomes non-conductive when the threshold switch flips over. The integral time behavior is automatically turned off in this manner when exceeding the threshold value, i.e., no delay occurs any longer at the end of the threshold switch signal.

Another proposal of the present invention resides in that an additional time element is arranged in parallel to the time element provided in the feedback circuit and operable for a positive voltage, which additional time element is constituted by a resistance end capacity and is effectively exclusively for negative voltages by means of a diode connected in series with the same. It can be achieved in this manner that acceleration and deceleration signals are weighted or evaluated differently.

It should be expressly mentioned in that connection that the features of the present invention described in detail hereinabove are not mutually exclusive. Instead, these features can be combined for the application in a fully electronic brake force control system in which the signal voltage proportional to the wheel acceleration is realized by electrical differentiation of an electrical voltage proportional to the rotational speed of the wheel. The amplifier provided thereby for the electronic differentiation may be utilized at the same time also for the influenced integral time behavior. It is particularly advantageous if, according to the present invention, the turning off or discontinuance of the integral time behavior is combined by means of a conventional electronic switching element with the differing weighting or evaluation of acceleration and deceleration by means of an additional time element. It is thereby additionally proposed in accordance with the present invention that for a limitation of the output voltages in both directions two oppositely connected diodes, preferably Zener diodes, are arranged in parallel to the feedback circuit.

Accordingly, it is an object of the present invention to provide a brake force control system for vehicles, especially for motor vehicles, which avoids by simple means the aforementioned shortcomings and drawbacks encountered in the prior art.

Another object of the present invention resides in a brake force control system for vehicles which permits a filtering out of error signals, yet does not unfavorably influence the control cycles during the brake force control.

A further object of the present invention resides in a brake force control system for vehicles, especially for motor vehicles in which acceleration and deceleration signals can be weighted differently.

These and other objects, features and advantages of the present invention will become more apparent from the following description when taken in connection with the accompanying drawing which shows, for purposes of illustration only, several embodiments in accordance with the present invention, and wherein:

FIG. 3 is a schematic circuit diagram of a modified embodiment with a turn-off effect in accordance with the present invention;

FIG. 4 is a schematic diagram explaining the operation of the arrangement according to FIG. 3;

FIG. 5 is a schematic circuit diagram of a still further modified arrangement in accordance with the present invention for the differing evaluation of acceleration and deceleration, and, FIG. 6 is a schematic wiring diagram of a combined installation in accordance with the present invention.

Figure 1:
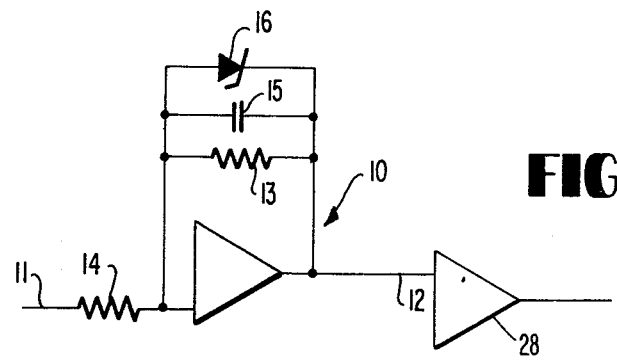
FIG. 1 is a schematic circuit diagram of an arrangement with a limit-effect in accordance with the present invention.

Referring now to the drawing wherein like reference numerals are used through the various views to designate like parts, and more particularly to FIG. 1, the part of interest herein of an electronic brake force control installation for motor vehicles which as to the rest is of conventional construction and therefore not illustrated herein, is constructed as operational amplifier generally designated by reference numeral 10. The pulses of the wheel sensor prepared by the electronic apparatus of conventional construction are fed to the operational amplifier 10 by way of a line 11 constituting the input thereof. The line 12, constituting the output thereof, is applied to a conventional threshold switch 28 providing an output which serves for the control of the actuating members (not shown), for example, of the solenoid valves in the brake circuit. A resistance element 13 is connected in the feedback circuit of the operational amplifier, which together with the input resistance element 14 determines the proportional amplification of the operational amplifier. A condenser element 15 is connected in parallel with the resistance element 13, which together with the latter effects the integral time behavior of the operational amplifier. A Zener diode 16 is again connected in parallel with the condenser element 15, which limits the output voltage in the line 12 to a value directly above the threshold value of the switch 28.

Figure 2:
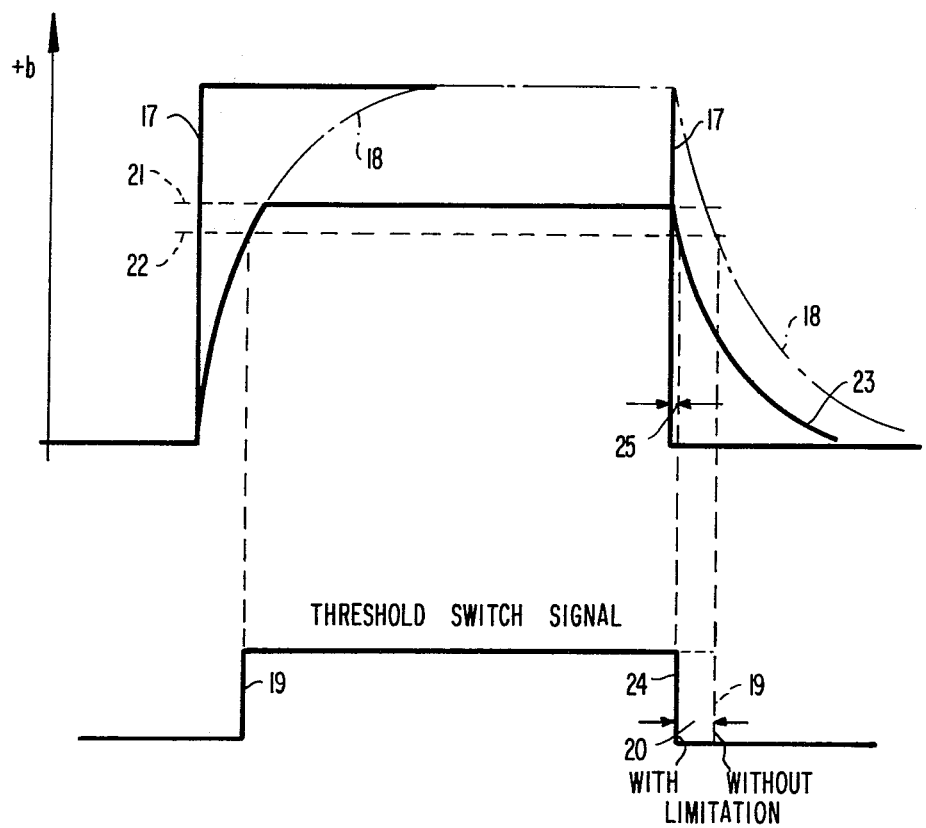
FIG. 2 is a schematic diagram explaining the operation of the arrangement according to FIG. 1.

According to FIG. 2 the operational amplifier normally has operating characteristics represented by the full line curve 17. An integral time behavior, i.e., an integral transient phenomenon results due to the additional interconnection of the condenser 15, which modifies the characteristics represented by curve 17 so that the integral time behavior now proceeds at the beginning and at the end according to the dash and dot line curve 18. It follows therefrom that the threshold switch signal represented in the lower part of FIG. 2 proceeds according to curve 19. Even though during the beginning of the now occuring delay for the filtering of the spurious signals is necessary, the analogously resulting delay at the end — represented by the distance 20 — is highly undesirable. The parallel connection of the diode 16 now limits the rise of the voltage of the operational amplifier to a value 21 which lies directly above the switching threshold 22 of the switch 28. As a result thereof the characteristics of the integral time behavior now proceeds at the end according to the full line curve 23 and the threshold switch signal (see thereby the lower part of the figure) collapses already according to the full line 24. Consequently, the threshold switch signal is therefore shortened in a desired manner at the end and deviates compared to the ideal condition only by the slight value now represented by the distance 25.

According to FIG. 3 the operational amplifier 10 is connected together with the resistance elements 13 and 14 and the condenser 15 in a manner already described. A field effect transistor 26 is now connected in series with the resistance 13 and a condenser 15; the transistor 26 is thereby controlled by way of the line 27 from the threshold switch 28. This control takes place in such a manner that the transistor 26 is blocked when the threshold switch 28 flips over, i.e., the effect of the condenser 15 and therewith the integral time behavior is effectively turned off when reaching the threshold value. A resistance 29 thereby enables the discharge of the condenser 15.

The operation of the arrangement of FIG. 3 can be seen from FIG. 4. According to this figure, at the beginning the voltage again follows the full line curve 18 conditioned by the integral time behavior, but only up to the point when the switching threshold 22 is reached. From there on the voltage follows the original characteristics 17 of the operational amplifier due to the effective disconnection of the condenser 15, i.e., it can be clearly recognized that now at the end of the signal, also the slight time delay according to the arrangement of FIG. 1 — represented by the distance 25 in FIG. 2 — is eliminated.

According to FIG. 5 the operational amplifier 10 is again connected with the resistance elements 13 and 14 as well as with the condenser element 15 in the manner described above and provides an output to the threshold switch 28. An additional time element generally designated by reference numeral 30 is now connected in the feedback branch in parallel with the resistance element 13 and the condenser 15. The additional time element 30 again consists of a resistance element 31 and of a condenser element 32. In series therewith is connected a diode 33 which lets this time element 30 become effective exclusively in the presence of negative voltages. A differing integral time behavior for positive and negative voltages, i.e., therefore for accelerations or decelerations can be achieved thereby.

FIG. 6 illustrates a combination of the arrangements described so far. The operational amplifier 10 is at first again connected with the resistance elements 13 and 14 and the condenser 15 corresponding to FIG. 1. In the input a further condenser 34 is connected in series with the resistance 14, which together with the resistance 13 represents the time constant of the differentiator. Similar to FIG. 5 an additional time element generally designated by reference numeral 30 is now connected in parallel in the feedback circuit so that positive and negative voltages are weighted or evaluated differently. A further condenser 35 effects that upon the described switching the time constant of the integral behavior is changed. The condenser 35 can be connected or disconnected as time determining element by means of the field effect transistor 26 arranged in a manner similar to FIG. 3, for example, in dependence on reaching the threshold value of the threshold switch 28 similar to FIG. 3. Additionally, two mutually oppositely series connected diodes 36 and 37 are arranged in the feedback circuit in parallel to the condensers 15 and 35. The diodes 36 and 37 may be constructed as Zener diodes. They limit the output voltage to a predetermined value in both directions, i.e., for positive and negative voltages. The arrangement described in this figure may be utilized, in addition to its use for the electronic differentiation, simultaneously also for the influenced integral time behavior.

While we have shown and described several embodiments in accordance with the present invention, it is understood that the same is not limited thereto but is susceptible of numerous changes and modifications as known to those skilled in the art; for example, the amplifiers, switching elements, diodes and/or circuit elements, may be formed by semiconductor devices and may be combined in an integrated circuit in a known manner. Consequently, we do not wish to be limited to the details shown and described herein but intend to cover all such changes and modifications as are encompassed by the scope off the appended claims.

We claim:

1. A threshold switching arrangement for use in brake force control systems and the like, characterized by an operational amplifier means having an input, an output and a feedback circuit means between said input and output including a parallel resistance-capacitance network means and further means connected with said network means for changing its operability in relation to a predetermined threshold value of the operational amplifier means, said further means including a further network connected in parallel with said network means and including a parallel connected resistance-condenser circuit series connected with a diode.

2. An arrangement according to claim 1, wherein the parallel resistance-capacitance network means includes a resistance connected in parallel with a capacitance with the parallel connected resistance and capacitance being connected between the input and output of the operational amplifier means, the further network being connected in parallel with the parallel resistance and capacitance.

3. A threshold switching arrangement for use in brake force control systems and the like, characterized by an operational amplifier means having an input, an output and a feedback circuit means between said input and output including a parallel resistance-capacitance network means and further means connected with said network means for changing its operability in relation to a predetermined threshold value of the operational amplifier means, said further means including a control element operable to effectively disconnect said network means and a further network connected in parallel with said network means and including a parallel connected resistance-condenser circuit series connected with a diode.

4. An arrangement according to claim 3, wherein said further means includes means for limiting the output voltages in both positive and negative directions.

5. An arrangement according to claim 4, wherein said further means includes a condenser element in parallel with said network means, said network means being series connected with a series circuit including a resistor and a condenser, the series circuit being connected at the input of the operational amplifier means.

6. An arrangement according to claim 5, wherein said control element includes a field effect transistor and said means for limiting includes first and second oppositely connected zener diodes connected in parallel with said network means.

7. A threshold switching arrangement for use in brake force control systems and the like, characterized by a noninverting operational amplifier means having an input, an output and a feedback circuit means between said input and output including a parallel resistance-capacitance network means formed of a resistor connected in parallel with a condenser and further means connected with said network means, said further means being responsive to the output of the operational amplifier means in relation to a predetermined threshold value for changing the operability thereof to maintain the output of the operational amplifier means at a prescribed level.

8. An arrangement according to claim 7, wherein said further means includes at least one diode always connected in parallel with said network means, said diode maintaining the output of the operational amplifier means at the prescribed level.

9. An arrangement according to claim 7, wherein said further means includes a control element operable to effectively disconnect said network means in response to the output of the operational amplifier means.

10. An arrangement according to claim 9, further including threshold switch means at the output of the operational amplifier means for controlling the control element.

11. An arrangement according to claim 7, wherein said further means includes means for limiting the output voltages of the operational amplifier means in both positive and negative directions.

12. An arrangement according to claim 11, wherein said means for limiting includes first and second oppositely connected Zener diodes connected in parallel with said network means.

13. An arrangement according to claim 7, wherein said further means includes a condenser element in parallel with said network means, said network means being series connected with a series circuit including a resistor and a condenser, the series circuit being connected at the input of the operational amplifier means.

14. A threshold switching arrangement according to claim 7, wherein the resistor has first and second terminals connected respectively to first and second terminals of the condenser, the parallel network being connected between the input and output of the operational amplifier means.

15. An arrangement according to claim 7, wherein said further means includes at least one Zener diode connected in parallel with said network means, said Zener diode maintaining the output of the operational amplifier means at the prescribed level.

* * * * *